(12) United States Patent
Chan et al.

(10) Patent No.: US 9,299,453 B2
(45) Date of Patent: Mar. 29, 2016

(54) SHIFT REGISTER AND VOLTAGE ADJUSTING CIRCUIT AND VOLTAGE ADJUSTING METHOD THEREOF

(71) Applicant: HannStar Display Corp., New Taipei (TW)

(72) Inventors: Chien-Ting Chan, Tainan (TW); Chung-Lin Chang, Kaohsiung (TW); Kuo-Sheng Lee, Tainan (TW)

(73) Assignee: HANNSTAR DISPLAY CORPORATION, New Taipei (TW)

( * ) Notice: Subject to any disclaimer, the term of this patent is extended or adjusted under 35 U.S.C. 154(b) by 57 days.

(21) Appl. No.: 13/964,647

(22) Filed: Aug. 12, 2013

(65) Prior Publication Data

US 2014/0044229 A1   Feb. 13, 2014

(30) Foreign Application Priority Data

Aug. 10, 2012   (CN) .......................... 2012 1 0284839

(51) Int. Cl.
| | |
|---|---|
| *G11C 19/00* | (2006.01) |
| *G11C 19/28* | (2006.01) |
| *G11C 19/18* | (2006.01) |
| *G09G 3/20* | (2006.01) |
| *G09G 3/36* | (2006.01) |

(52) U.S. Cl.
CPC ...... *G11C 19/28* (2013.01); *G09G 3/20* (2013.01); *G09G 3/3674* (2013.01); *G11C 19/18* (2013.01); *G11C 19/184* (2013.01); *G09G 2310/0286* (2013.01)

(58) Field of Classification Search
None
See application file for complete search history.

(56) References Cited

U.S. PATENT DOCUMENTS

| | | | | |
|---|---|---|---|---|
| 5,949,398 | A * | 9/1999 | Kim | 345/100 |
| 6,052,426 | A * | 4/2000 | Maurice | 377/78 |
| 7,664,218 | B2 * | 2/2010 | Tobita | 377/64 |
| 8,155,261 | B2 * | 4/2012 | Hu | 377/64 |
| 8,599,998 | B2 * | 12/2013 | Umezaki et al. | 377/64 |
| 2008/0007316 | A1 * | 1/2008 | Chen | 327/333 |
| 2010/0245298 | A1 * | 9/2010 | Chen et al. | 345/204 |
| 2011/0025398 | A1 * | 2/2011 | Chan | 327/333 |
| 2011/0193853 | A1 * | 8/2011 | Sakamoto et al. | 345/213 |
| 2012/0044132 | A1 * | 2/2012 | Koga et al. | 345/100 |
| 2013/0272487 | A1 * | 10/2013 | Tobita | 377/79 |
| 2014/0043222 | A1 * | 2/2014 | Han et al. | 345/100 |
| 2014/0064439 | A1 * | 3/2014 | Qing et al. | 377/75 |

* cited by examiner

*Primary Examiner* — Tuan T Lam

(74) *Attorney, Agent, or Firm* — Muncy, Geissler, Olds & Lowe, P.C.

(57) ABSTRACT

A shift register and a voltage adjusting circuit and method thereof are disclosed. The voltage adjusting circuit includes a first input terminal, a second input terminal, a transistor, a first capacitor, a second capacitor, and an output terminal. The first input terminal receives a second clock signal. The second input terminal receives a fourth clock signal. The transistor has a source electrode, a drain electrode, and a gate electrode. The source electrode is coupled to ground and the gate electrode is coupled to the second input terminal. The first capacitor is coupled between the drain electrode and the first input terminal. One end of second capacitor is coupled between the first capacitor and drain electrode, and the other end of second capacitor is coupled between the second input terminal and gate electrode. The output terminal is coupled between the first capacitor and drain electrode to output an adjusted voltage.

16 Claims, 6 Drawing Sheets

SHIFT REGISTER AND VOLTAGE ADJUSTING CIRCUIT AND VOLTAGE ADJUSTING METHOD THEREOF

BACKGROUND OF THE INVENTION

1. Field of the Invention

The invention relates to shift register circuit; in particular, to a voltage adjusting circuit applied in the shift register circuit using its voltage lowering mechanism to reduce the shift degree of threshold voltage of transistors in the shift register circuit.

2. Description of the Prior Art

In recent years, with the advances in display technology, liquid crystal displays have become the most widely used display device. In the driving circuit of the liquid crystal display, the main structure of a shift register circuit is a series of flip-flops; an output terminal of one flip-flop is coupled to an input terminal of next flip-flop. All flip-flops receive a common clock to move data from one stage to the next stage.

Please refer to FIG. 1 and FIG. 2. FIG. 1 and FIG. 2 illustrate a schematic diagram and a timing diagram of a conventional shift register circuit respectively. As shown in FIG. 1 and FIG. 2, in the conventional shift register circuit, as to the transistors NT2 and NT4, only in the periods of two pulses when the input terminal IN is at high level (the voltage is VDD) and the output terminal OUT is at high level (the voltage is VDD), the bias voltages of the gate-source voltages Vgs2 and Vgs4 of the transistors NT2 and NT4 will be zero. In other times, the bias voltages of the gate-source voltages Vgs2 and Vgs4 of the transistors NT2 and NT4 will be positive bias voltages.

In this condition, because the transistors NT2 and NT4 may generate serious threshold voltage shifts due to the positive bias voltages of the transistors NT2 and NT4. As shown in FIG. 3, the threshold voltages Vth2 and Vth4 of the transistors NT2 and NT4 will be increased with the increasing of using time t. Once the transistors NT2 and NT4 generate serious threshold voltage shifts, the threshold voltages of the transistors NT2 and NT4 will be larger than the normal value. This will cause the voltage decreasing of the output stage in the shift register circuit.

In addition, as another conventional shift register circuit shown in FIG. 4, when the voltage of the (n−1)th output stage OUTPUT (n−1) decreases, the first transistor T1 will generate current leakage, and the second transistor T2 fails to perform a bootstrapping mechanism, so that the voltage of the Q point will be abnormal, and the output voltage of the n-th output stage OUTPUT (n) will be also abnormal.

Therefore, the invention provides a voltage adjusting circuit applied in a shift register circuit and a voltage adjusting method thereof to solve the above-mentioned problems.

SUMMARY OF THE INVENTION

A scope of the invention is a voltage adjusting circuit applied in a shift register circuit. In a preferred embodiment, the voltage adjusting circuit includes a first input terminal, a second input terminal, a transistor, a first capacitor, a second capacitor, and an output terminal. The transistor has a source electrode, a drain electrode, and a gate electrode. The source electrode is coupled to ground and the gate electrode is coupled to the second input terminal. The first capacitor is coupled between the drain electrode and the first input terminal. One end of second capacitor is coupled between the first capacitor and drain electrode, and the other end of second capacitor is coupled between the second input terminal and gate electrode. The output terminal is coupled between the first capacitor and drain electrode to output an adjusted voltage.

In an embodiment, the first capacitance of the first capacitor ranges between 0.1 pF and 0.5 pF.

In an embodiment, the second capacitance of the second capacitor ranges between 0.1 pF and 0.50 pF.

In an embodiment, the output terminal is coupled to a shift register circuit.

Another scope of the invention is a voltage adjusting method. In a preferred embodiment, the voltage adjusting method includes steps of: providing a voltage adjusting circuit of the above-mentioned embodiment; inputting a second clock signal to the first input terminal; inputting a second clock signal to the first input terminal; outputting an adjusted voltage from the output terminal.

In an embodiment, when the second clock signal is shifted from low level to high level and the fourth clock signal is shifted from high level to low level, an input voltage is divided by the first capacitor and the second capacitor to form the adjusted voltage having a first voltage value.

In an embodiment, when the second clock signal is shifted from high level to low level and the fourth clock signal is shifted from low level to high level, the input voltage is divided by the first capacitor and the second capacitor to form the adjusted voltage having a second voltage value.

In an embodiment, the second voltage value is lower than the first voltage value.

In an embodiment, the adjusted voltage outputted from the output terminal can be changed by adjusting the first capacitor and the second capacitor.

In an embodiment, the second clock signal and the fourth clock signal have the same pulse width, and a distance between the second clock signal and the fourth clock signal equal to ½ the pulse width or the pulse width.

Another scope of the invention is a shift register. In a preferred embodiment, the shift register includes a voltage adjusting circuit of the above-mentioned embodiment, a first transistor, a second transistor, a third transistor, a fourth transistor, and a fifth transistor. The first transistor is coupled to the output terminal of the voltage adjusting circuit; the second transistor is coupled to the first transistor; the third transistor is coupled to the second transistor and ground; the fourth transistor is coupled to the first transistor, the third transistor, and ground; the fifth transistor is coupled to the first transistor, the second transistor, the third transistor, and the fourth transistor.

Another scope of the invention is a shift register voltage adjusting method. In a preferred embodiment, the shift register voltage adjusting method includes steps of: providing a shift register of the above-mentioned embodiment; inputting a second clock signal to the first input terminal; inputting a fourth clock signal to the first input terminal; outputting an adjusted voltage from the output terminal to the first gate electrode of the first transistor.

Compared to the prior art, the voltage adjusting circuit of the invention uses two capacitors to reduce the threshold voltage shift degree of the transistors in the shift register circuit in a voltage-dividing way to avoid current leakage, so that the output voltage of the output stage will be recovered to normal state. Therefore, the stability of the shift register circuit can be effectively enhanced, and the using time of the shift register circuit will be also increased to extend the life time of the liquid crystal display.

The advantage and spirit of the invention may be understood by the following detailed descriptions together with the appended drawings.

BRIEF DESCRIPTION OF THE APPENDED DRAWINGS

DETAILED DESCRIPTION OF THE INVENTION

A preferred embodiment of the invention is a voltage adjusting circuit. In this embodiment, the voltage adjusting circuit can be applied in a shift register circuit of a liquid crystal display to reduce threshold voltage shift degree of the transistors in the shift register circuit to increase the stability and life time of the liquid crystal display, but not limited to this.

Figure 1:
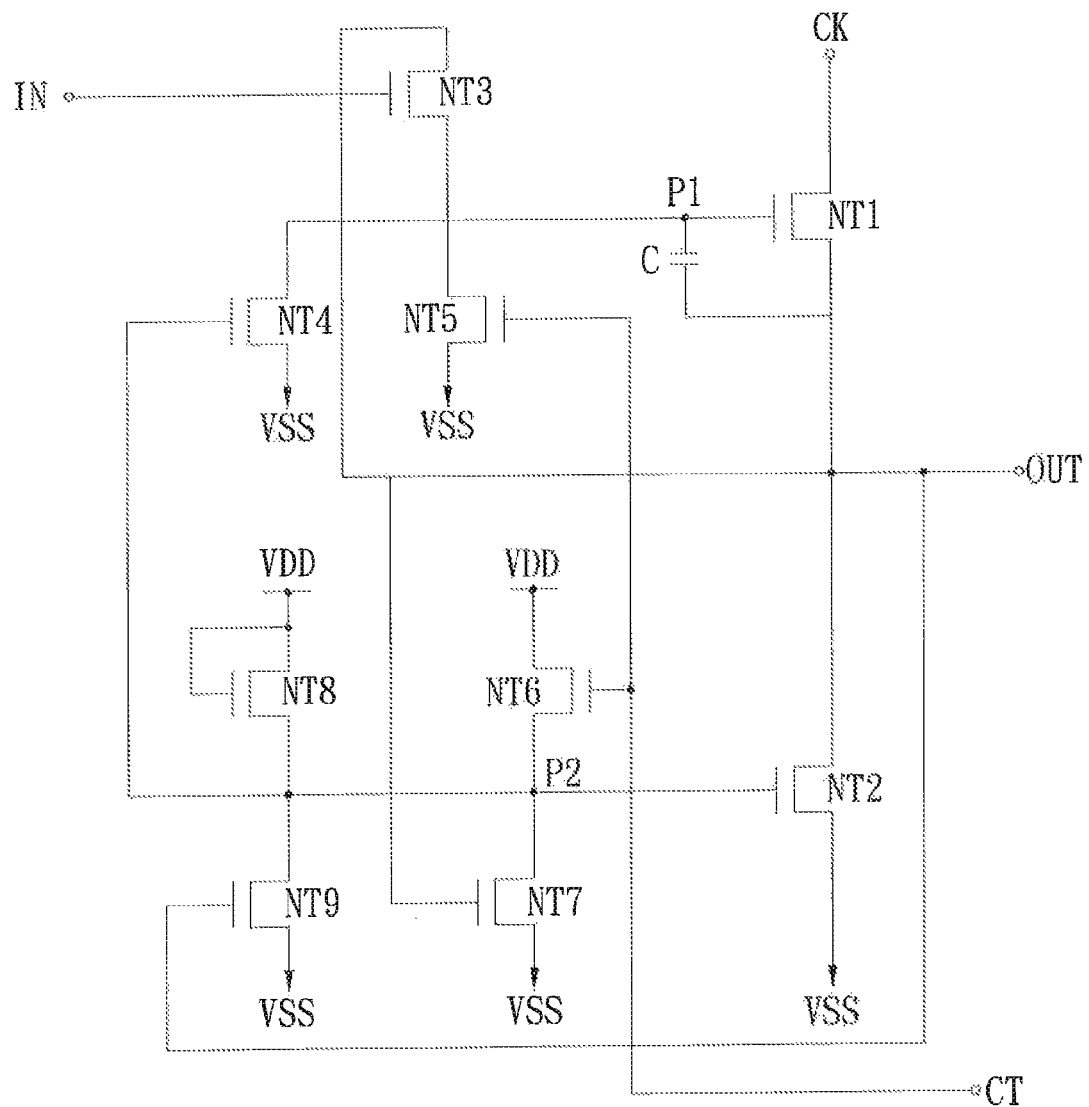
FIG. 1 and FIG. 2 illustrate a schematic diagram and a timing diagram of a conventional shift register circuit respectively.
Figure 2:
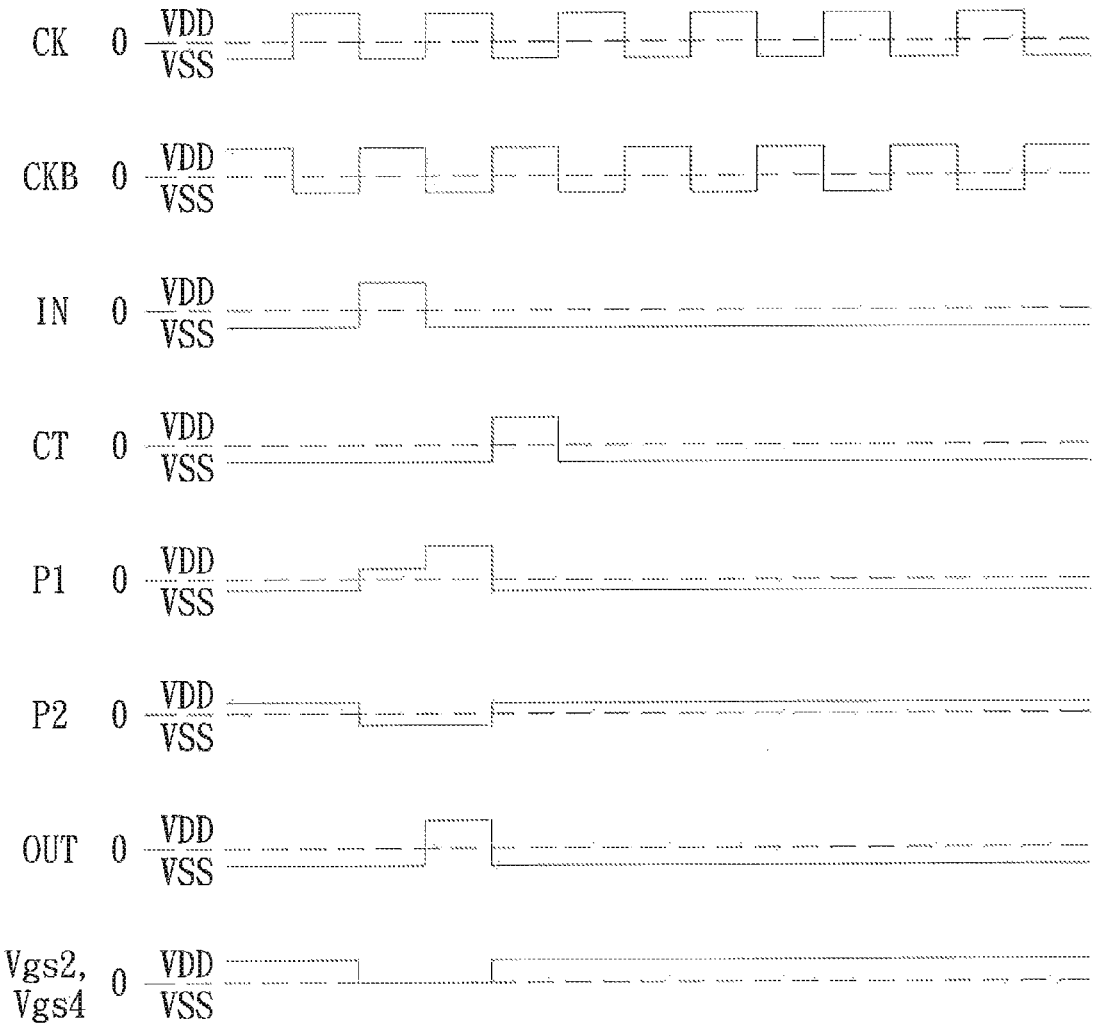
Figure 3:
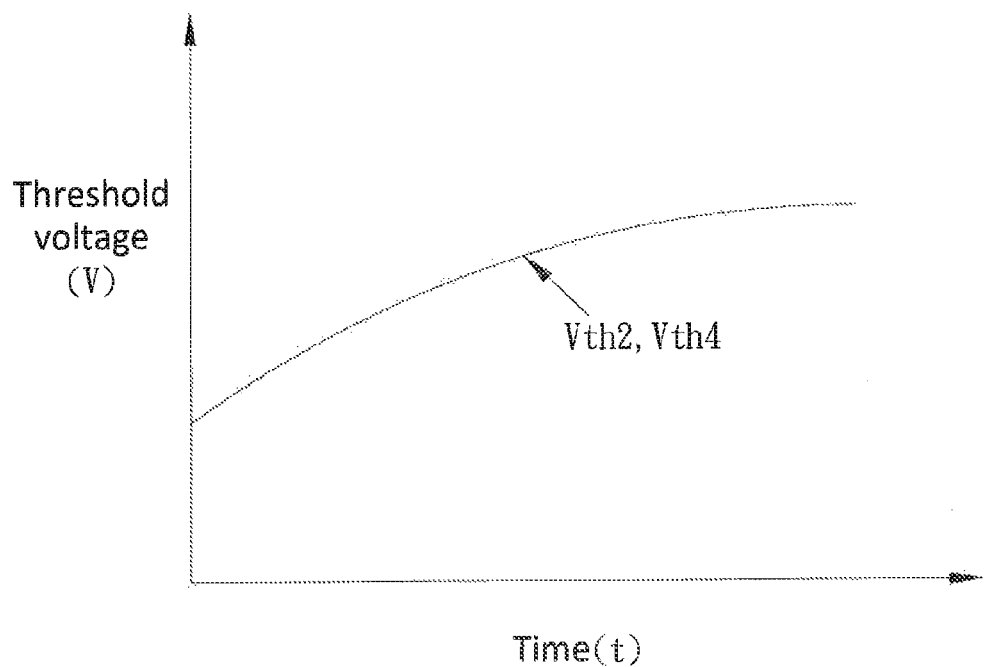
FIG. 3 illustrates a schematic diagram of the threshold voltages of the conventional transistors increasing with the using time.
Figure 4:
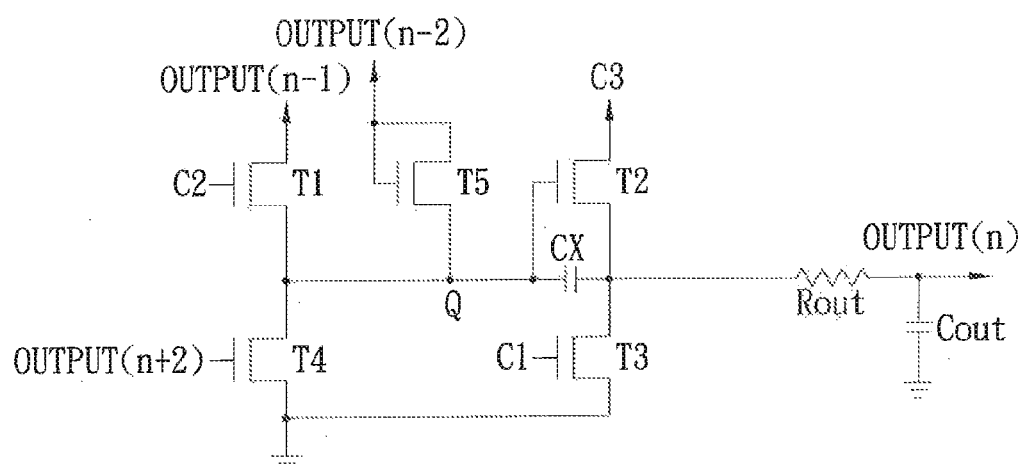
FIG. 4 illustrates a schematic diagram of another conventional shift register circuit.
Figure 5:
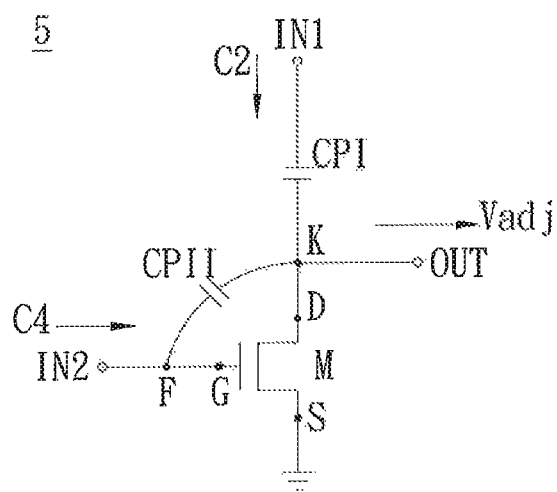
FIG. 5 illustrates a schematic diagram of a voltage adjusting circuit in an embodiment of the invention.

Please refer to FIG. 5. FIG. 5 illustrates a schematic diagram of the voltage adjusting circuit in this embodiment. As shown in FIG. 5, the voltage adjusting circuit 5 in this embodiment includes a first input terminal IN1, a second input terminal IN2, a transistor M, a first capacitor CPI, a second capacitor CPII, and an output terminal OUT. The transistor M has a source electrode S, a drain electrode D, and a gate electrode G.

The source electrode S is coupled to ground and the gate electrode G is coupled to the second input terminal IN2. The first capacitor CPI is coupled between the drain electrode D of the transistor M and the first input terminal IN1. One end of second capacitor CPII is coupled to a node K located between the first capacitor CPI and the drain electrode D of the transistor M, and the other end of the second capacitor CPII is coupled to a node F located between the second input terminal IN2 and the gate electrode G of the transistor M. The output terminal OUT is coupled to a node K located between the first capacitor CPI and the drain electrode D of the transistor M.

Figure 6:
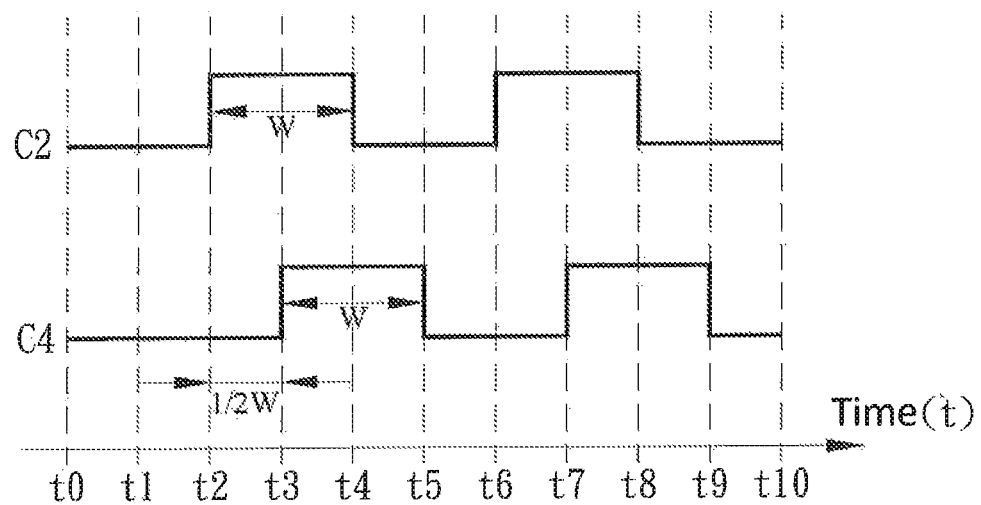
FIG. 6 illustrates timing diagrams of the second clock signal and the fourth clock signal.

The first input terminal IN1 and the second input terminal IN2 are used to receive a second clock signal C2 and a fourth clock signal C4 respectively. Please refer to FIG. 6. FIG. 6 illustrates timing diagrams of the second clock signal C2 and the fourth clock signal C4. As shown in FIG. 6, the second clock signal C2 and the fourth clock signal C4 have the same pulse width W, but a distance between the second clock signal C2 and the fourth clock signal C4 can be ½ pulse width W or 1 pulse width W. It should be noticed that the second clock signal C2 and the fourth clock signal C4 shown in FIG. 6 are only one embodiment of the invention, the clock signals actually received by the input terminal are not limited to this.

After the input voltage is adjusted by the voltage adjusting circuit 5, an adjusted voltage Vadj is outputted from the output terminal OUT. In this embodiment, the voltage adjusting circuit 5 can change the adjusted voltage Vadj outputted from the output terminal OUT by adjusting the capacitance CP1 of the first capacitor CPI and the capacitance CP2 of the second capacitor CPII. Wherein, it is preferred that the capacitance CP1 of the first capacitor CPI ranges between 0.1 pF and 0.5 pF and the capacitance CP2 of the second capacitor CPII ranges between 0.1 pF and 0.5 pF, but not limited to this.

As shown in FIG. 6, the second clock signal C2 is maintained at low level from time t0 to time t2; the second clock signal C2 is shifted from low level to high level at time t2 and maintained at high level from time t2 to time t4; the second clock signal C2 is shifted from high level to low level at time t4 and maintained at low level from time t4 to time t6; the second clock signal C2 is shifted from low level to high level at time t6 and maintained at high level from time t6 to time t8; the second clock signal C2 is shifted from high level to low level at time t8 and maintained at low level from time t8 to time t10, and so on.

The fourth clock signal C4 is maintained at low level from time t0 to time t3; the fourth clock signal C4 is shifted from low level to high level at time t3 and maintained at high level from time t3 to time t5; the fourth clock signal C4 is shifted from high level to low level at time t5 and maintained at low level from time t5 to time t7; the fourth clock signal C4 is shifted from low level to high level at time t7 and maintained at high level from time t7 to time t9; the fourth clock signal C4 is shifted from high level to low level at time t9 and maintained at low level from time t9 to time t11, and so on.

When the second clock signal C2 is shifted from low level to high level (at times t2 and t6) and the fourth clock signal C4 is shifted from high level to low level (at times t5 and t9), the first capacitor CPI and the second capacitor CPII of the voltage adjusting circuit 5 will divide the input voltage to form an adjusted voltage Vadj having a first voltage (for example, 8V); when the second clock signal C2 is shifted from high level to low level (at times t4 and t8) and the fourth clock signal C4 is shifted from low level to high level (at times t3 and t7), the first capacitor CPI and the second capacitor CPII of the voltage adjusting circuit 5 will divide the input voltage to form an adjusted voltage Vadj having a second voltage (for example, −10V). In this embodiment, the adjusted voltage Vadj outputted from the output terminal OUT has the second voltage (for example, −10V) lower than the first voltage (for example, 8V). Therefore, the voltage adjusting circuit 5 can effectively provide the adjusted voltage Vadj by using its voltage lowering mechanism to lower the input voltage.

Next, the operation of the voltage adjusting circuit 5 applied in a shift register circuit SR of a liquid crystal display will be introduced as follows.

Figure 7:
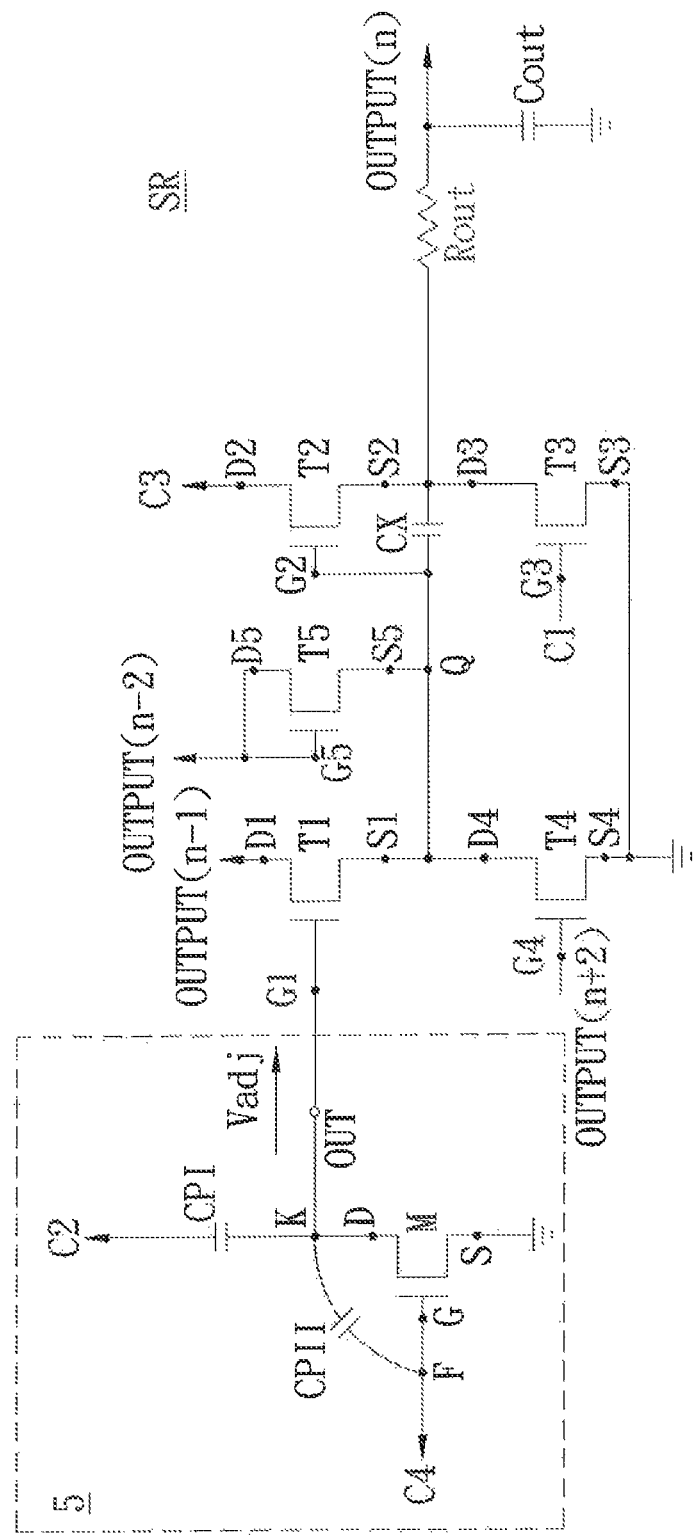
FIG. 7 illustrates a schematic diagram of the voltage adjusting circuit applied in the shift register circuit.
Figure 8:
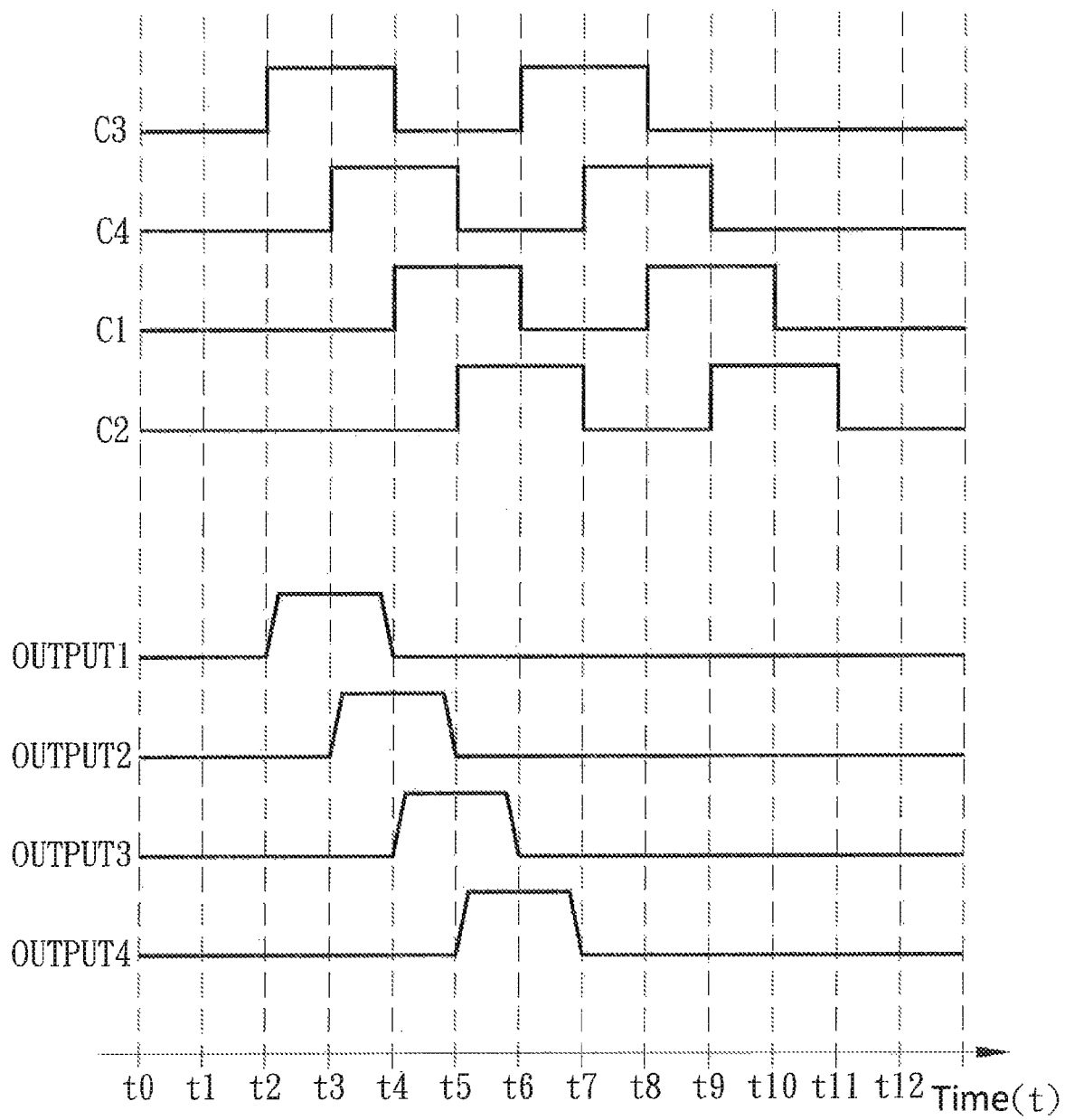
FIG. 8 illustrates timing diagrams of the clock signals and the output signals of the output stages.

Please refer to FIG. 7. FIG. 7 illustrates a schematic diagram of the voltage adjusting circuit applied in the shift register circuit. As shown in FIG. 7, the first capacitor CPI is coupled between the second clock signal C2 and the node K; the second capacitor CPII is coupled between the node K and the node F; the gate electrode G of the transistor M is coupled to the node F; the drain electrode D of the transistor M is coupled to the node K; the source electrode S of the transistor M is coupled to ground; the node K is located between the first capacitor CPI and the drain electrode D of the transistor M and between the second capacitor CPII and the output terminal OUT; the node F is located between the fourth clock signal C4 and the gate electrode G of the transistor M. FIG. 8 illustrates timing diagrams of the clock signals and the output signals of the output stages.

The shift register circuit SR at least includes a first transistor T1, a second transistor T2, a third transistor T3, a fourth transistor T4, a fifth transistor T5, a capacitor CX, an output resistor Rout, and an output capacitor Cout. Wherein, the first transistor T1 has a first gate electrode G1, a first drain electrode D1, and a first source electrode S1; the second transistor T2 has a second gate electrode G2, a second drain electrode D2, and a second source electrode S2; the third transistor T3 has a third gate electrode G3, a third drain electrode D3, and a third source electrode S3; the fourth transistor T4 has a fourth gate electrode G4, a fourth drain electrode D4, and a fourth source electrode S4; the fifth transistor T5 has a fifth gate electrode G5, a fifth drain electrode D5, and a fifth source electrode S5. In fact, other transistors, such as a sixth transistor, a seventh transistor, can be further disposed in the structure of the shift register circuit SR based on practical needs, not limited to this.

In the first transistor T1, the first gate electrode C1 is coupled to the output terminal OUT of the voltage adjusting circuit 5 and receives the adjusted voltage Vadj from the output terminal OUT; the first drain electrode D1 is coupled to a (n−1) output stage OUTPUT (n−1); the first source electrode S1 is coupled to the fourth drain electrode D4 of the fourth transistor T4. In the second transistor T2, the second gate electrode G2 is coupled between the node Q and the capacitor CX; the second drain electrode D2 is coupled to the third clock signal C3; the second source electrode S2 is coupled to the third drain electrode D3 of the third transistor T3.

In the third transistor T3, the third gate electrode G3 is coupled to the first clock signal C1; the third drain electrode D3 is coupled to the second source electrode S2 of the second transistor T2; the third source electrode S3 is coupled to ground.

In the fourth transistor T4, the fourth gate electrode G4 is coupled to the (n+2)th output stage OUTPUT(n+2); the fourth drain electrode D4 is coupled to the first source electrode S1 of the first transistor T1; the fourth source electrode S4 is coupled to ground.

In the fifth transistor T5, the fifth gate electrode G5 is coupled to the (n−2)th output stage OUTPUT (n−2); the fifth drain electrode D5 is also coupled to the (n−2)th output stage OUTPUT (n−2); the fifth source electrode S5 is coupled to the node Q.

The capacitor CX is coupled between the node Q and a output resistor Rout; the output resistor Rout is coupled between the capacitor CX and the n-th output stage OUTPUT (n), wherein n is a positive integer; one end of the output capacitor Cout is coupled between the output resistor Rout and the n-th output stage OUTPUT (n), and the other end of the output capacitor Cout is coupled to ground.

In prior arts, when the voltage adjusting circuit 5 is not applied in the shift register circuit SR, the first gate electrode G1 of the first transistor T1 is coupled to the second clock signal C2 (−10V~+15V), serious threshold voltage shifting will be generated to cause the decreasing of the (n−1)th output stage OUTPUT (n−1), and current leakage will be generated at the first transistor T1, so that the output voltage of the n-th output stage OUTPUT (n) become abnormal.

In this invention, when the voltage adjusting circuit 5 is applied in the shift register circuit SR, the first gate electrode G1 of the first transistor T1 will receive the adjusted voltage Vadj outputted from the output terminal OUT of the voltage adjusting circuit 5, and use the adjusted voltage Vadj as the gate voltage VG1 of the first transistor T1. When the voltage adjusting circuit 5 is applied in the shift register circuit SR, there will be two operation modes as follows.

Under a first operation mode, when the first clock signal C1, the second clock signal C2, and the (n−1)th output stage OUTPUT (n−1) are all at high level, the first transistor T1 has a gate voltage VG1 of (Vgh−Vss)*[CP1/(CP1+CP2+CgsM)]. Wherein, (Vgh−Vss) represents a voltage difference between a high level gate voltage Vgh and a common ground voltage Vss; CgsM represents a gate-source capacitance of the transistor M. It is assumed that (Vgh−Vss)=25, CP1=0.2, CP2=0.07, CgsM=0.01, and the gate voltage VG1 of the first transistor T1 will be 8V. At this time, the gate voltage VG1 of the first transistor T1 is still larger than the threshold voltage Vgh1 (usually 1.5V~2V) of the first transistor T1.

Under a second operation mode, when the second clock signal C2 is at high level and the first clock signal C1 and the (n−1)th output stage OUTPUT (n−1) are at low level, the first transistor T1 has a gate voltage VG1 of (Vgh−Vss)*[CP1/(CP1+CP2+CgsM+Cgs1+Cgd1)]. Wherein, Cgs1 represents a gate-source capacitance of the first transistor T1; Cgd1 represents a gate-drain capacitance of the first transistor T1. It is assumed that (Vgh−Vss)=25, CP1=0.2, CP2=0.07, CgsM=0.01, Cgs1=0.1, Cgd1=0.1, and the gate voltage VG1 of the first transistor T1 will be 0.5V. At this time, the gate voltage VG1 of the first transistor T1 will be smaller than the threshold voltage Vgh1 (usually 1.5V~2V) of the first transistor T1.

It should be noticed that under the second operation mode, when the second clock signal C2 is at high level and the first clock signal C1 and the (n−1)th output stage OUTPUT (n−1) are at low level, the gate voltage VG1 of the first transistor T1 will be continuously operated in a voltage range from 0.5V to −10V, and the voltage range is smaller than the threshold voltage Vgh1 (usually 1.5V~2V) of the first transistor T1. For example, when the gate voltage VG1 of the first transistor T1 is 0.5V, it can make the node Q discharge to −10V. Therefore, when the voltage adjusting circuit 5 is applied in the shift register circuit SR, no matter the first transistor T1 generates shift of the threshold voltage Vgh1, the threshold voltage shift degree of the first transistor T1 will be effectively reduced to avoid the current leakage generated at the first transistor T1, so that the output voltage of the n-th output stage OUTPUT (n) will be recovered to normal state. Therefore, as shown in FIG. 8, the output voltages OUTPUT1~OUTPUT4 will be maintained in normal state without any abnormal conditions such as surge occurred in the prior arts.

Compared to the prior art, the voltage adjusting circuit of the invention uses two capacitors to reduce the threshold voltage shift degree of the transistors in the shift register circuit in a voltage-dividing way to avoid current leakage, so that the output voltage of the output stage will be recovered to normal state. Therefore, the stability of the shift register circuit can be effectively enhanced, and the using time of the shift register circuit will be also increased to extend the life time of the liquid crystal display.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A shift register, comprising:
   a voltage adjusting circuit, comprising:
   a first input terminal;
   a second input terminal;
   a transistor having a source electrode, a drain electrode, and a gate electrode, wherein the source electrode is coupled to ground and the gate electrode is coupled to the second input terminal;
   a first capacitor, having a first capacitance, coupled between the drain electrode of the transistor and the first input terminal;
   a second capacitor, having a second capacitance, one end of the second capacitor being coupled between the first capacitor and the drain electrode, and the other end of the second capacitor being coupled between the second input terminal and the gate electrode; and an output terminal, coupled between the first capacitor and the drain electrode of the transistor;

a first transistor, coupled to the output terminal of the voltage adjusting circuit;

a second transistor, coupled to the first transistor;

a third transistor, coupled to the second transistor and ground;

a fourth transistor, coupled to the first transistor, the third transistor, and ground; and a fifth transistor, coupled to the first transistor, the second transistor, the third transistor, and the fourth transistor;

wherein the fourth transistor comprises a fourth gate electrode, a fourth drain electrode, and a fourth source electrode, the fourth gate electrode is coupled to a (n+2)th output stage, the fourth drain electrode is coupled to the first transistor, and the fourth source electrode is coupled to the third transistor and ground.

2. The shift register of claim 1, further comprising:
a capacitor, one end of the capacitor coupling between the second transistor and the third transistor and the other end of the capacitor coupling to the fifth transistor.

3. The shift register of claim 1, further comprising:
an output resistor, one end of the output resistor coupling between the second transistor and the third transistor and the other end of the capacitor coupling to a n-th output stage, wherein n is a positive integer; and an output capacitor, one end of the output capacitor coupling between the output resistor and the n-th output stage and the other end of the output capacitor coupling to ground.

4. The shift register of claim 1, wherein the first transistor comprises a first gate electrode, a first drain electrode, and a first source electrode, the first gate electrode is coupled to the output terminal of the voltage adjusting circuit, the first drain electrode is coupled to a (n−1)th output stage, and the first source electrode is coupled to the fourth transistor and the fifth transistor.

5. The shift register of claim 1, wherein the second transistor comprises a second gate electrode, a second drain electrode, and a second source electrode, the second gate electrode is coupled between the second source electrode and the fifth transistor, the second drain electrode is coupled to a third clock signal, and the second source electrode is coupled to the third transistor.

6. The shift register of claim 1, wherein the third transistor comprises a third gate electrode, a third drain electrode, and a third source electrode, the third gate electrode is coupled to a first clock signal, the third drain electrode is coupled to the second transistor, and the third source electrode is coupled to the fourth transistor and ground.

7. The shift register of claim 1, wherein the fifth transistor comprises a fifth gate electrode, a fifth drain electrode, and a fifth source electrode, the fifth gate electrode is coupled to a (n−2)th output stage, the fifth drain electrode is coupled between the fifth gate electrode and the (n−2)th output stage, and the fifth source electrode is coupled between the first transistor and the second transistor.

8. A shift register voltage adjusting method, comprising steps of:

providing a shift register of claim 1;
inputting a second clock signal to the first input terminal;
inputting a fourth clock signal to the first input terminal; and
outputting an adjusted voltage from the output terminal to a first gate electrode of the first transistor.

9. The shift register voltage adjusting method of claim 8, wherein under a first operation mode, when a first clock signal, the second clock signal, and a (n−1)th output stage are at high level, the first gate electrode of the first transistor has a gate voltage of $(Vgh-Vss)*[CP1/(CP1+CP2+CgsM)]$; wherein $(Vgh-Vss)$ represents a voltage difference between a high level gate voltage Vgh and a common ground voltage Vss; CgsM represents a gate-source capacitance of the transistor of the voltage adjusting circuit; at this time, the gate voltage of the first gate electrode of the first transistor is larger than a threshold voltage of the first transistor.

10. The shift register voltage adjusting method of claim 8, wherein under a second operation mode, when the second clock signal is at high level and a first clock signal and a (n−1)th output stage are at low level, the first gate electrode of the first transistor has a gate voltage of $(Vgh-Vss)*[CP1/(CP1+CP2+CgsM+Cgs1+Cgd1)]$; wherein $(Vgh-Vss)$ represents a voltage difference between a high level gate voltage Vgh and a common ground voltage Vss; CgsM represents a gate-source capacitance of the transistor of the voltage adjusting circuit; Cgs1 represents a gate-source capacitance of the first transistor; Cgd1 represents a gate-drain capacitance of the first transistor; at this time, the gate voltage of the first gate electrode of the first transistor is larger than a threshold voltage of the first transistor.

11. The shift register voltage adjusting method of claim 8, wherein under a second operation mode, the gate voltage of the first gate electrode of the first transistor will be continuously operated in a voltage range smaller than the threshold voltage of the first transistor.

12. The shift register of claim 1, wherein the first capacitance of the first capacitor ranges between 0.1 pF and 0.5 pF, and the second capacitance of the second capacitor ranges between 0.1 pF and 0.5 pF.

13. The shift register voltage adjusting method of claim 8, wherein when the second clock signal is shifted from low level to high level and the fourth clock signal is shifted from high level to low level, an input voltage is divided by the first capacitor and the second capacitor to form the adjusted voltage having a first voltage value.

14. The shift register voltage adjusting method of claim 13, wherein when the second clock signal is shifted from high level to low level and the fourth clock signal is shifted from low level to high level, the input voltage is divided by the first capacitor and the second capacitor to form the adjusted voltage having a second voltage value.

15. The shift register voltage adjusting method of claim 14, wherein the second voltage value is lower than the first voltage value.

16. The shift register voltage adjusting method of claim 8, wherein the adjusted voltage outputted from the output terminal can be changed by adjusting the first capacitor and the second capacitor.

* * * * *